(12) United States Patent
Matsuo et al.

(10) Patent No.: US 11,410,914 B2
(45) Date of Patent: Aug. 9, 2022

(54) POWER MODULE

(71) Applicant: KABUSHIKI KAISHA TOSHIBA, Minato-ku (JP)

(72) Inventors: Keiichiro Matsuo, Yokohama (JP); Jun Karasawa, Shinagawa (JP); Haruka Yamamoto, Yokohama (JP); Shinya Hayashiyama, Shinagawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/926,008

(22) Filed: Jul. 10, 2020

(65) Prior Publication Data
US 2021/0090974 A1 Mar. 25, 2021

(30) Foreign Application Priority Data

Sep. 24, 2019 (JP) .............................. JP2019-173456

(51) Int. Cl.
*H01L 23/492* (2006.01)
*H01L 23/00* (2006.01)
*H01L 25/07* (2006.01)
*H01L 23/31* (2006.01)

(52) U.S. Cl.
CPC ........ *H01L 23/492* (2013.01); *H01L 23/3135* (2013.01); *H01L 24/33* (2013.01); *H01L 24/48* (2013.01); *H01L 24/73* (2013.01); *H01L 24/83* (2013.01); *H01L 25/072* (2013.01); *H01L 2224/48091* (2013.01);

(Continued)

(58) Field of Classification Search
None
See application file for complete search history.

(56) References Cited

U.S. PATENT DOCUMENTS 10,304,788 B1 * 5/2019 Kim ................... H01L 23/3135
2012/0080800 A1 * 4/2012 Shinohara ........... H01L 23/3121
257/773

(Continued)

FOREIGN PATENT DOCUMENTS

DE 11 2008 003 425 T5 10/2010
DE 10 2011 084 803 A1 4/2012

(Continued)

*Primary Examiner* — Michelle Mandala
*Assistant Examiner* — Jordan M Klein
(74) *Attorney, Agent, or Firm* — Oblon, McClelland, Maier & Neustadt, L.L.P.

(57) ABSTRACT

A power module includes: a base plate having a first surface; electrode plate provided at the first surface; a wire connected to a semiconductor chip and the electrode plate; a metal member connected to the electrode plate; a terminal plate; a first resin layer, a connection portion of the wire and the semiconductor chip being disposed inside the first resin layer; and a second resin layer provided on the first resin layer and having a lower elastic modulus than the first resin layer. The terminal plate includes a bonding portion contacting an upper surface of the metal member, a curved portion curved upward from the bonding portion. The curved portion is disposed inside the second resin layer, and a length from the first surface of a lower surface of the bonding portion is greater than a length from the first surface of the connection portion.

10 Claims, 3 Drawing Sheets

(52) U.S. Cl.
CPC ............... *H01L 2224/48227* (2013.01); *H01L 2224/73265* (2013.01); *H01L 2224/8385* (2013.01)

(56) References Cited

U.S. PATENT DOCUMENTS

2015/0289369 A1* 10/2015 Sunaga ................ H05K 3/3431
 361/783
2018/0033711 A1* 2/2018 Hartung .................. H01L 24/48

FOREIGN PATENT DOCUMENTS

| JP | 2015-23226 A | 2/2015 |
|---|---|---|
| JP | 6057927 B2 | 1/2017 |

\* cited by examiner

COMPARATIVE ART

COMPARATIVE ART

POWER MODULE

CROSS-REFERENCE TO RELATED APPLICATIONS

This application is based upon and claims the benefit of priority from Japanese Patent Application No. 2019-173456, filed on Sep. 24, 2019; the entire contents of which are incorporated herein by reference.

FIELD

An embodiment relates to a power module.

BACKGROUND

A power module has been developed in which a semiconductor chip for power control is provided in a housing, and electrical power is input and output by connecting terminal plates to the semiconductor chip from outside the housing. In such a power module, the housing is filled with an insulative gel material to maintain the insulated state of the internal circuit, the terminal plates, etc. It is anticipated that the conduction amount of power modules will increase further hereafter, and countermeasures for the heat generation due to the conduction will be challenging.

DETAILED DESCRIPTION

Figure 1:
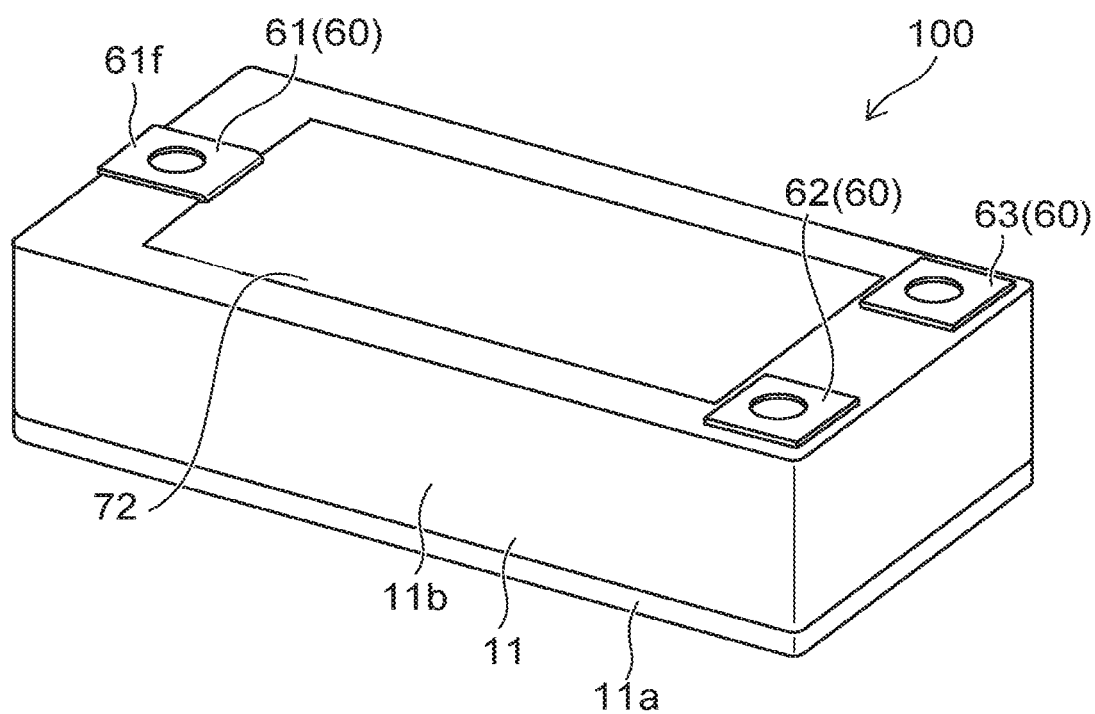
FIG. 1 is a perspective view showing a power module according to an embodiment.

A power module according to an embodiment includes: a base plate having a first surface; multiple electrode plates provided at the first surface; a semiconductor chip provided on the first surface; a wire connected to the semiconductor chip and one of the electrode plates; a metal member connected to one of the electrode plates; a terminal plate; a first resin layer, a connection portion of the wire and the semiconductor chip being disposed inside the first resin layer; and a second resin layer that is provided on the first resin layer and has a lower elastic modulus than the first resin layer. The terminal plate includes a bonding portion contacting an upper surface of the metal member and extending along the upper surface, a curved portion curved upward from the bonding portion, and a draw-out portion drawn out externally from the curved portion. The curved portion is disposed inside the second resin layer, and a length from the first surface of a lower surface of the bonding portion is greater than a length from the first surface of the connection portion.

The embodiment will be described hereinafter with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions. In the specification and drawings, components similar to those described previously or illustrated in an antecedent drawing are marked with like reference numerals, and a detailed description is omitted as appropriate.

Embodiment

Figure 2A:
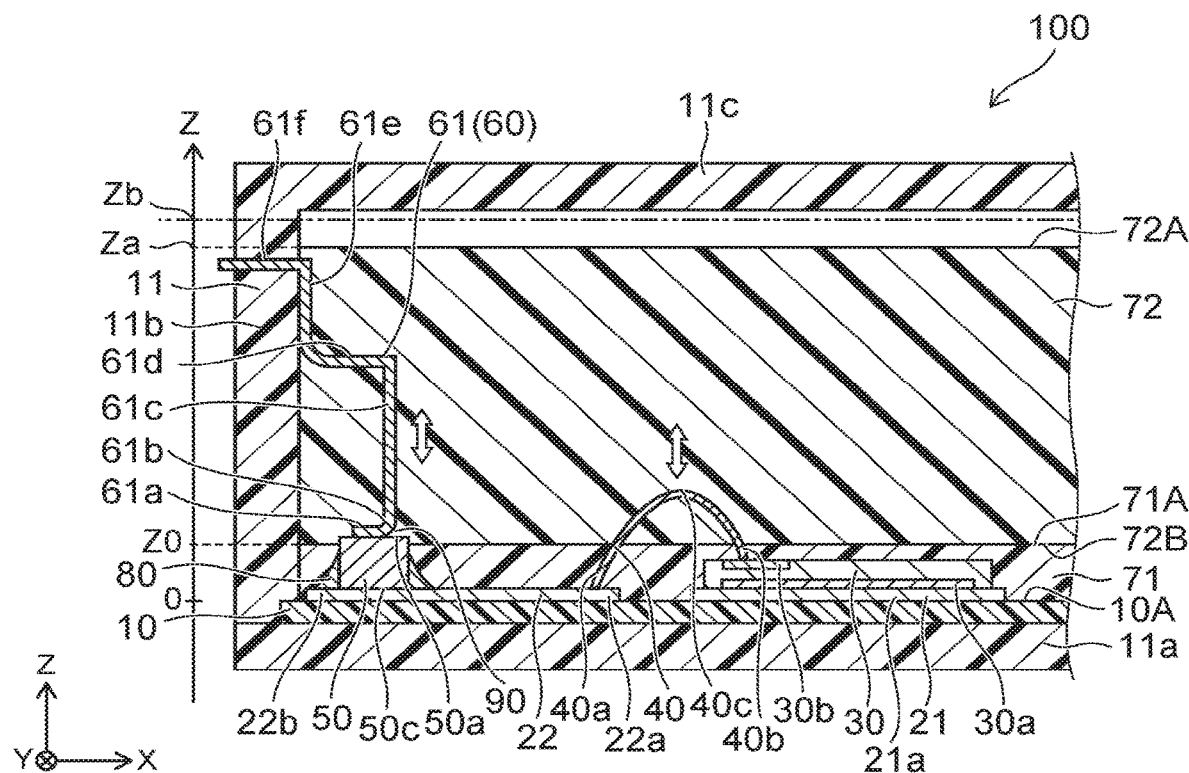
FIG. 2A is a partial cross-sectional view showing the power module according to the embodiment.
Figure 2B:
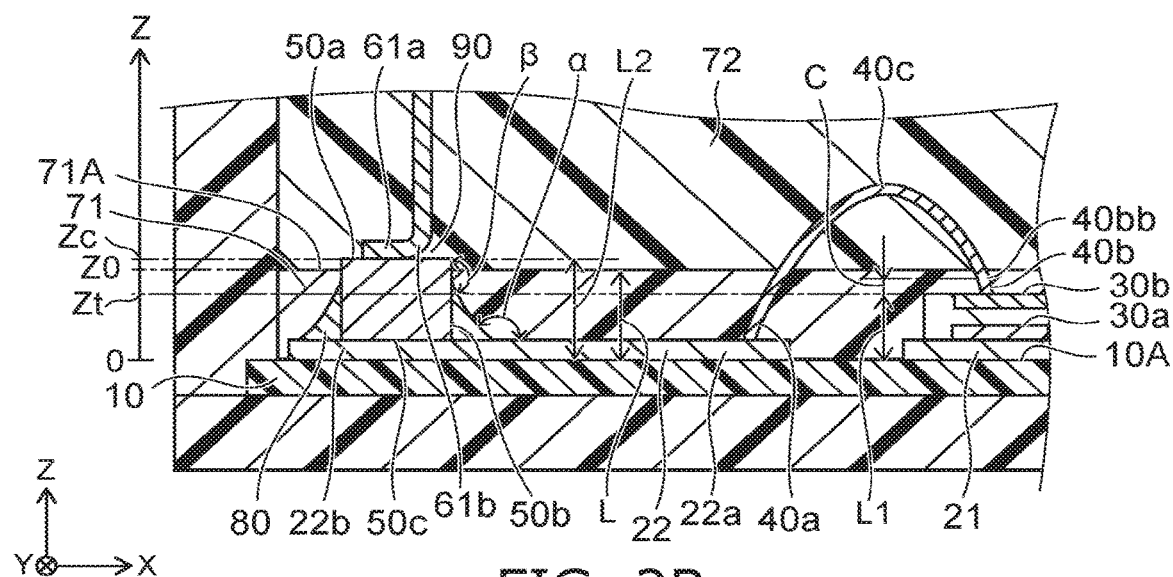
FIG. 2B is a partially enlarged cross-sectional view of FIG. 2A.

FIG. 1 is a perspective view showing a power module according to the embodiment. An upper surface portion 11c of a housing 11 described below is not illustrated in FIG. 1. FIG. 2A is a partial cross-sectional view showing the power module according to the embodiment. FIG. 2B is a partially enlarged cross-sectional view of FIG. 2A.

As shown in FIG. 1, the overall shape of the power module 100 of the embodiment is a substantially rectangular parallelepiped. The housing 11 is provided in the power module 100. The housing 11 substantially forms the exterior form of the power module 100.

As shown in FIG. 1 and FIGS. 2A and 2B, the power module 100 mainly includes a base plate 10 fitted into a bottom surface portion 11a of the housing 11, multiple electrode plates 21 and 22 provided in a plane at an upper surface 10A which is a first surface of the base plate 10, multiple semiconductor chips 30 including upper surface electrodes 30b, a first resin layer 71 and a second resin layer 72 that fill the interior of the power module 100, multiple terminal plates 61, 62, and 63 for external connection, and multiple internal wiring terminal plates (hereinbelow, also generally referred to as simply the "terminal plate 60").

In the power module 100, electrical power from an external power supply inflows via the terminal plates 62 and 63 for input, the electrical power is converted by the multiple semiconductor chips 30, and the converted electrical power is output externally from the power module 100 through the terminal plate 61 for output.

For convenience of description, a direction that is along the long side of the first surface 10A is taken as an X-direction in FIGS. 2A and 2B. A direction that is perpendicular to the X-direction and is along the short side of the first surface 10A is taken as a Y-direction. A direction that is perpendicular to the XY plane is taken as a Z-direction. Although the direction from the base plate 10 toward the first resin layer 71 and the second resin layer 72 in the Z-direction is taken as up, and the reverse direction is taken as down, "up" and "down" are used for convenience in the description and do not always match the direction of gravity.

The power module 100 further includes a metal member 50 disposed between the electrode plate 22 and the external connection terminal plate 61 and connecting the electrode plate 22 and the external connection terminal plate 61, a bonding member 80 connecting the metal member 50 and the electrode plate 22, and a wire 40 connecting the electrode plate 22 and the upper surface electrode 30b of the semiconductor chip 30.

The external output terminal plate 61, the semiconductor chip 30 that outputs the current to the terminal plate 61, the metal member 50 that connects the terminal plate 61 and the semiconductor chip 30, the electrode plate 22, and the wire 40 will now be described in detail. Although the external output terminal plate 61 is described in the description recited below, this is similar for the other terminal plates 60 as well.

The housing 11 is made of, for example, an insulating resin material and is formed by combining the bottom surface portion 11a forming the lower surface, a sidewall portion 11b forming the side surface, and the upper surface portion 11c forming the upper surface. The housing 11 is hollow inside.

The semiconductor chip 30 is arranged with another semiconductor chip 30 on the first surface 10A of the base plate 10. The semiconductor chip 30 is, for example, a rectangular parallelepiped of which the lengths in the X-direction and the Y-direction are greater than the length in the Z-direction. The semiconductor chip 30 includes a lower surface electrode 30a connected to an end portion 21a of the electrode plate 21 at the lower surface of the semiconductor chip 30, and the upper surface electrode 30b connected to a chip connection portion 40b of the wire 40 at the upper surface of the semiconductor chip 30.

For example, the base plate 10 is formed of an insulative ceramic and is substantially plate-shaped and parallel to the XY plane. The electrode plates 21 and 22 contact the first surface 10A of the base plate 10 and are provided to be substantially parallel to the first surface 10A. For example, the electrode plates 21 and 22 are formed in the desired wiring configuration by stamping one copper plate. The electrode plates 21 and 22 extend to the vicinities of the terminal plates 60 and the multiple semiconductor chips 30 as appropriate and are connected to the terminal plates 60 and the semiconductor chips 30 by soldering, ultrasonic bonding, silver sintering, etc. Specifically, the end portion 21a of the electrode plate 21 is disposed under the semiconductor chip 30 and is connected to the lower surface electrode 30a of the semiconductor chip 30 by, for example, soldering.

The electrode plate 22 connects the terminal plate 61 and the upper surface electrode 30b of the semiconductor chip 30.

A first connection portion 22a which is a portion of the electrode plate 22 is disposed at the periphery of the semiconductor chip 30, and a second connection portion 22b which is another portion of the electrode plate 22 is disposed below the terminal plate 61. The first connection portion 22a is connected to an electrode plate connection portion 40a which is the end portion of the wire 40 connected to the upper surface electrode 30b of the semiconductor chip 30.

The metal member 50 is disposed on the second connection portion 22b. The second connection portion 22b is connected to a lower surface 50c of the metal member 50 by the bonding member 80 which is, for example, solder, etc.; therefore, the outer edge of the electrode plate 22 is positioned outside the outer edge of the lower surface 50c of the metal member 50 when viewed from above so that the bonding member 80 does not drop off the electrode plate 22. The electrode plate 22 is connected to the terminal plate 61 via the metal member 50 because the second connection portion 22b is connected to the metal member 50 which is connected to the terminal plate 61.

The metal member 50 includes a metal, e.g., copper, and has, for example, a rectangular parallelepiped shape; the surfaces of the metal member 50 include an upper surface 50a, the lower surface 50c, and four side surfaces 50b. However, the configuration is not limited thereto; it is sufficient for the metal member 50 to have the upper surface 50a and the lower surface 50c. The upper surface 50a is, for example, rectangular and is parallel to the lower surface of a bonding portion 61a of the terminal plate 61. For example, the lower surface 50c also is rectangular and is parallel to the second connection portion 22b of the electrode plate 22. The side surfaces 50b rise in the Z-direction from the four sides of the lower surface 50c and are linked to the four sides of the upper surface 50a.

The lower surface 50c occupies a narrower region than the second connection portion 22b because the lower surface 50c is connected to the second connection portion 22b of the electrode plate 22. The upper surface 50a occupies a wider region than the bonding portion 61a because the upper surface 50a is bonded to the bonding portion 61a of the terminal plate 61.

For example, the bonding member 80 is made from solder or the like, contacts the metal member 50 and the second connection portion 22b, and fixes and connects the metal member 50 and the second connection portion 22b by self-hardening. Specifically, the bonding member 80 is provided in contact with the four side surfaces 50b of the metal member 50 and the second connection portion 22b at the side surface 50b periphery and spreads downward.

The terminal plate 61 includes the bonding portion 61a contacting the upper surface 50a of the metal member 50, a curved portion 61b curved upward from the bonding portion 61a, a first intermediate portion 61c extending upward in the Z-direction from the curved portion 61b, a second intermediate portion 61d extending further along the XY plane from the first intermediate portion 61c, a third intermediate portion 61e extending further upward in the Z-direction from the second intermediate portion 61d, and a draw-out portion 61f that extends further along the XY plane from the third intermediate portion 61e by bending and is drawn out of the housing 11. The bonding portion 61a, the curved portion 61b, the first intermediate portion 61c, the second intermediate portion 61d, the third intermediate portion 61e, and the draw-out portion 61f are formed to have a continuous body and are arranged in this order. The terminal plate 61 includes copper and is formed by, for example, stamping and bending a copper plate. The terminal plate 61 is aligned inside the housing 11 by fixing the bonding portion 61a by bonding to the metal member 50 and fixing the draw-out portion 61f by clamping between the upper surface portion 11c and the sidewall portion 11b of the housing 11.

The bonding portion 61a is parallel to the upper surface 50a of the metal member 50 and extends along the upper surface 50a. The bonding portion 61a contacts the upper surface 50a and is bonded to the upper surface 50a by, for example, ultrasonic bonding. The lower surface of the bonding portion 61a is smaller than the upper surface 50a. The curved portion 61b is curved upward to link the bonding portion 61a parallel to the XY plane and the first intermediate portion 61c extending in the Z-direction. The curved portion 61b separates from the upper surface 50a of the metal member 50 while curving upward; thereby, a wedge-like gap 90 is formed between the lower surface of the curved portion 61b and the upper surface 50a of the metal member 50. The second resin layer 72 enters the gap 90. The draw-out portion 61f is drawn out externally from the curved portion 61b via the first intermediate portion 61c, the second intermediate portion 61d, and the third intermediate portion 61e and includes a portion exposed outside the power module 100.

The wire 40 connects the electrode plate 22 and the upper surface electrode 30b of the semiconductor chip 30. For example, the wire 40 is wire-shaped and is formed of aluminum, etc. One end of the wire 40 is the chip connection portion 40b connected to the semiconductor chip 30 and is connected to the upper surface electrode 30b of the semiconductor chip 30 by, for example, ultrasonic bonding. The other end of the wire 40 is the electrode plate connection portion 40a connected to the electrode plate 22 and is connected to the first connection portion 22a of the electrode plate 22 by, for example, ultrasonic bonding, etc. There are also cases where the electrode plate connection portion 40*a* and the chip connection portion 40*b* are constrained by the bonding, are hardened by alloying, and have bulging spherical shapes.

The length in the Z-direction of the metal member 50 and the length in the Z-direction of the terminal plate 61 are set so that a length L1 from the first surface 10A of the base plate 10 to the chip connection portion 40*b* of the wire 40 is less than a length L2 from the first surface 10A to the bonding portion 61*a* of the terminal plate 61.

When a spherical shape is formed in the chip connection portion 40*b*, it is favorable to set the length from the first surface 10A to the upper end of the spherical shape of the chip connection portion 40*b* of the wire 40 to be less than the length L2.

Considering the hardening of the wire 40 due to the bonding of the chip connection portion 40*b*, it is favorable to set the length from the first surface 10A to the upper end of a connection effect portion 40*bb* to be less than L2 for the connection effect portion 40*bb* formed at the end portion of the wire 40 at the chip connection portion 40*b* side. The connection effect portion 40*bb* is a portion where the bendability is reduced due to, for example, a change of the crystal structure of the wire 40 due to the effects of heat when connecting the chip connection portion 40*b* and the upper surface electrode 30*b* of the semiconductor chip 30. The length in the Z-direction of the connection effect portion 40*bb* is taken as C. It is favorable for the value of C to be, for example, 0.2 to 1 mm.

For an upper portion 40*c* of the wire 40 which is the highest portion of the wire 40, it is favorable for the length from the first surface 10A to the upper portion 40*c* to be less than L2.

The first resin layer 71 and the second resin layer 72 fill the internal space surrounded with the base plate 10 and the housing 11 and guarantee the insulation between the multiple terminal plates 61, 62, and 63, the semiconductor chip 30, the electrode plates 21 and 22, the wire 40, etc. The second resin layer 72 is disposed on the first resin layer 71.

The elastic modulus of the first resin layer 71 is greater than the elastic modulus of the second resin layer 72. The thermal expansion coefficient of the first resin layer 71 is less than the thermal expansion coefficient of the second resin layer 72. The first resin layer 71 includes, for example, an epoxy resin. The second resin layer 72 includes, for example, polymer silicone and is an insulative gel resin.

The first resin layer 71 is provided on the first surface 10A. A lower surface of the first resin layer 71 contacts the first surface 10A and the electrode plates 21 and 22.

A position ZO in the Z-axis of an upper surface 71A of the first resin layer 71 is positioned higher than a position Zt in the Z-axis of the chip connection portion 40*b* of the wire 40 and lower than a position Zc in the Z-axis of the lower surface of the bonding portion 61*a* of the terminal plate 61. In terms of the length from the first surface 10A, a length L to the upper surface 71A of the first resin layer 71 is greater than the length L1 to the chip connection portion 40*b* of the wire 40 and less than the length L2 to the bonding portion 61*a* of the terminal plate 61. In such a case, the chip connection portion 40*b* of the wire 40, the semiconductor chip 30, and the electrode plates 21 and 22 which are lower than the position Zt in the Z-axis and the portions of the metal member 50, the bonding member 80, and the wire 40 that are lower than the upper surface 71A of the first resin layer 71 are disposed inside the first resin layer 71.

It is more favorable to use the upper end of the spherical shape of the chip connection portion 40*b* as the position Zt in the Z-axis when the chip connection portion 40*b* has a spherical shape. In terms of the length from the first surface 10A, it is more favorable for the length L1 to be the length to the upper end of the spherical shape of the chip connection portion 40*b*. In such a case, the spherical chip connection portion 40*b* of the wire 40, the semiconductor chip 30, and the electrode plates 21 and 22 which are lower than the position Zt in the Z-axis and the portions of the metal member 50, the bonding member 80, and the wire 40 that are lower than the upper surface 71A of the first resin layer 71 are disposed inside the first resin layer 71.

When considering the hardening of the wire 40 due to the bonding of the chip connection portion 40*b*, it is more favorable to use the position in the Z-axis of the upper end of the connection effect portion 40*bb* as Zt. In terms of the length from the first surface 10A, it is more favorable for the length L1 to be the length to the upper end of the connection effect portion 40*bb*. In such a case, the connection effect portion 40*bb* of the wire 40, the semiconductor chip 30, and the electrode plates 21 and 22 which are lower than the position Zt in the Z-axis and the portions of the metal member 50, the bonding member 80, and the wire 40 that are lower than the upper surface 71A of the first resin layer 71 are disposed inside the first resin layer 71.

It is more favorable to use the position in the Z-axis of the upper portion 40*c* which is the highest portion of the wire 40 as Zt. In terms of the length from the first surface 10A, it is more favorable to use the length to the upper portion 40*c* as L1. In such a case, the wire 40, the semiconductor chip 30, and the electrode plates 21 and 22 which are lower than the position Zt in the Z-axis and the portions of the metal member 50, the bonding member 80, and the wire 40 that are lower than the upper surface 71A of the first resin layer 71 are disposed inside the first resin layer 71.

Regardless of which of the chip connection portion 40*b*, the spherical shape upper end, the upper end of the connection effect portion 40*bb*, or the upper portion 40*c* is used as the reference for Zt and L1, the terminal plate 61 is not disposed inside the first resin layer 71. The electrode plates 21 and 22, the semiconductor chip 30, and the portions of the metal member 50, the bonding member 80, and the wire 40 that are lower than the upper surface 71A of the first resin layer 71 are disposed inside the first resin layer 71 and insulated by the first resin layer 71.

The second resin layer 72 is provided on the first resin layer 71, and the entire surface of a lower surface 72B of the second resin layer 72 is closely adhered to the entire surface of the upper surface 71A of the first resin layer 71. Accordingly, the position ZO in the Z-axis of the lower surface 72B of the second resin layer 72 is positioned higher than the position Zt in the Z-axis of the chip connection portion 40*b* of the wire 40 and lower than the position Zc in the Z-axis of the lower surface of the bonding portion 61*a* of the terminal plate 61. Thereby, the chip connection portion 40*b* of the wire 40 is not disposed inside the second resin layer 72.

When the spherical shape is formed in the chip connection portion 40*b*, it is more favorable for the position in the Z-axis of the upper end of the spherical shape to be used as Zt. In terms of the length from the first surface 10A, it is more favorable for the length L1 to be the length to the upper end of the spherical shape. Thereby, the spherical shape of the chip connection portion 40*b* of the wire 40 is not disposed inside the second resin layer 72.

When considering the connection effect portion 40*bb*, it is more favorable to use the position in the Z-axis of the upper end of the connection effect portion 40*bb* as Zt. In terms of the length from the first surface 10A, it is more favorable for the length L1 to be the length to the upper end of the connection effect portion 40bb. Thereby, the connection effect portion 40bb of the wire 40 is not disposed inside the second resin layer 72.

It is more favorable to use the position in the Z-axis of the upper portion 40c of the wire 40 as Zt. In terms of the length from the first surface 10A, it is more favorable for the length L1 to be the length to the upper portion 40c. In such a case, the entire wire 40 is not disposed inside the second resin layer 72.

Regardless of which of the chip connection portion 40b, the spherical shape upper end, the upper end of the connection effect portion 40bb, or the upper portion 40c is used as the reference for Zt and L1, the electrode plate connection portion 40a and the chip connection portion 40b of the wire 40 are not disposed inside the second resin layer 72. Also, the terminal plate 61 other than the portion of the draw-out portion 61f exposed externally and the portion of the metal member 50 including at least the upper surface 50a that is higher than the lower surface 72B of the second resin layer 72 are disposed inside the second resin layer 72.

The operation due to the conduction of the power module 100 will now be described. FIG. 2A schematically shows the deformation when thermal expansion of the first resin layer 71 and the second resin layer 72 occurs due to heat generation due to the conduction. The position in the Z-axis of an upper surface 72A of the second resin layer 72 before the heat generation is taken as Za, and the position in the Z-axis of the upper surface 72A of the second resin layer 72 after the heat generation due to the conduction is taken as Zb. Compared to the second resin layer 72, the thermal expansion of the first resin layer 71 is small because the first resin layer 71 has a lower thermal expansion coefficient than the second resin layer 72; therefore, to simplify the description, the position of the upper surface 71A of the first resin layer 71 is taken as ZO and does not change before and after the conduction.

When heat generation occurs due to the conduction, the position of the upper surface 71A of the first resin layer 71 remains at ZO; therefore, the lower surface 72B of the second resin layer 72 that contacts the upper surface 71A of the first resin layer 71 substantially is not displaced and remains at ZO. The upper surface 72A of the second resin layer 72 expands upward, stress inside the second resin layer 72 is applied upward, and the terminal plates 60 and the wire 40 that are disposed inside the second resin layer 72 are subjected to upward stress.

Even when stress is applied upward to the second resin layer 72, the second resin layer 72 which has a low elastic modulus and low thermal stress does not separate easily from the surface of the terminal plate 61. Therefore, at the wedge-like gap 90 between the lower surface of the curved portion 61b and the upper surface 50a of the metal member 50 as well, the second resin layer 72 does not separate easily and continues to closely adhere. Thereby, during the heat generation due to the conduction as well, the second resin layer 72 continues to maintain the insulation properties for the terminal plate 61.

Also, the portions of the wire 40 other than the electrode plate connection portion 40a and the chip connection portion 40b have excellent bendability, etc., and therefore are not damaged easily by breaking, etc., due to the upward stress from the second resin layer 72 undergoing thermal expansion even when disposed inside the second resin layer 72. Also, the second resin layer 72 continues to maintain the insulation properties for the wire 40 disposed inside the second resin layer 72 without separating from the wire 40.

The electrode plate connection portion 40a and the chip connection portion 40b of the wire 40 have low bendability by being adhered by ultrasonic bonding are fixed and disposed inside the first resin layer 71 which has a high elastic modulus and a low thermal expansion coefficient. Therefore, the electrode plate connection portion 40a and the chip connection portion 40b are not easily subjected to upward stress and difficult to break.

When the spherical shape is formed in the chip connection portion 40b due to the bonding, by using the upper end of the spherical shape as Zt, the portion up to the upper end of the spherical shape is fixed and disposed inside the first resin layer 71, and the effects of the upward stress occurring due to the heat generation can be reduced further. When considering the connection effect portion 40bb hardened by the bonding, by using the upper end of the connection effect portion 40bb as Zt, the portion up to the connection effect portion 40bb also is fixed and disposed inside the first resin layer 71, and the effects of the upward stress can be reduced further. When the upper portion 40c of the wire 40 is used as Zt, the entire wire 40 is fixed and disposed inside the first resin layer 71, and the effects of the upward stress can be reduced further.

Effects of the embodiment will now be described. In the embodiment, the electrode plate connection portion 40a and the chip connection portion 40b of the wire 40 that have bendability reduced by the bonding are fixed and disposed inside the first resin layer 71 having a low elastic modulus and a low thermal expansion coefficient; therefore, fatigue fracture does not occur easily even when the electrical power inflows from the outside and generates heat. Also, even when the spherical shape is formed in the chip connection portion 40b due to the bonding, the entire spherical shape chip connection portion 40b can be protected if the portion up to the upper end of the spherical shape are fixed and disposed inside the first resin layer 71. Also, if the portions up to the upper end of the connection effect portion 40bb hardened by the bonding of the chip connection portion 40b are fixed and disposed inside the first resin layer 71, the connection effect portion 40bb also can be protected by the first resin layer 71. Also, if the entire wire 40 is fixed and disposed inside the first resin layer 71, the entire wire 40 can be protected by the first resin layer 71.

In the embodiment, the gel second resin layer 72 enters the wedge-like gap 90. Therefore, even if the curved portion 61b of the terminal plate 61 has micro displacement upward due to the upward stress due to the second resin layer 72 expanding due to the heat generation when conducting, the gel second resin layer 72 that is disposed in the gap 90 can deform with the micro displacement of the curved portion 61b; therefore, the second resin layer 72 does not separate easily from the lower surface of the curved portion 61b. Therefore, the reliability of the power module 100 according to the embodiment is high.

The bonding member 80 spreads out and adheres to cover the side surfaces 50b of the metal member 50 and the surface of the second connection portion 22b of the electrode plate 22 which have a substantially orthogonal relationship; therefore, an angle cc between the second connection portion 22b of the electrode plate 22 and the surface of the bonding member 80 and an angle β between the surface of the side surface 50b and the surface of the bonding member 80 can be obtuse; therefore, the separating of the first resin layer 71 from the electrode plate 22, the metal member 50, and the bonding member 80 can be suppressed even if the upward stress of the second resin layer 72 is transmitted via the terminal plate 61.

Thus, in the power module 100 according to the embodiment, the fatigue fracture of the wire 40 can be suppressed even when the heat generation amount increases as the conduction amount increases and thermal expansion of the second resin layer 72 occurs. Also, even when stress is applied to the terminal plate 61 by the expansion of the second resin layer 72, the separating of the second resin layer 72 from the lower surface of the curved portion 61b can be suppressed, and the insulation properties can be guaranteed. Accordingly, the reliability of the power module 100 can be increased.

Although the external output terminal plate 61 is described in the embodiment, the embodiments are not limited thereto. For example, similar effects can be provided when used for the input terminal plates 62 and 63 and the internal wiring terminal plates, which are other terminal plates of the power module 100, and for the semiconductor chips 30 connected to the terminal plates.

Although the semiconductor chip 30 and the external output terminal plate 61 connected to the semiconductor chip 30 are described in the embodiment, the embodiment is not limited thereto. The same effects are provided also for the relationship between another semiconductor chip 30 and the terminal plate 60 not directly connected to the semiconductor chip 30.

Figure 3A:
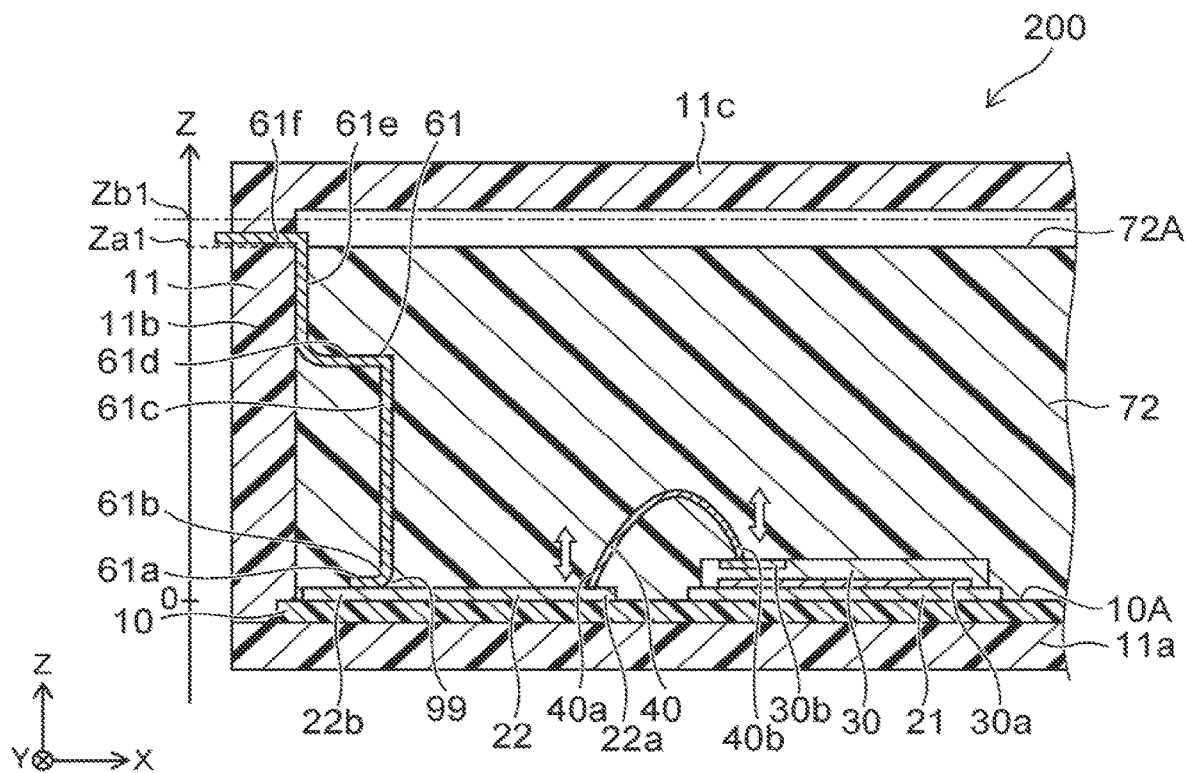
FIG. 3A is a partial cross-sectional view showing a power module according to a comparative example 1.

Operations of a power module 200 of a comparative example 1 and a power module 300 of a comparative example 2 in which the structure of the embodiment is not used will now be described. FIG. 3A is a partial cross-sectional view showing the power module according to the comparative example 1. Only the gel second resin layer 72 is filled as the resin layer in the power module 200.

As shown in FIG. 3A, the upper surface 10A of the base plate 10 is taken as 0 of the Z-axis. The position of the upper surface 72A of the second resin layer 72 before the conduction is Za1. When heat is generated inside the power module 200 by the conduction, thermal expansion of the second resin layer 72 occurs, and the upper surface 72A of the second resin layer 72 is displaced to Zb1. When the second resin layer 72 expands, upward thermal stress is generated inside the second resin layer 72; therefore, for example, upward stress is applied to the wire 40, etc. When the conduction ends and the heat decreases, the second resin layer 72 contracts to the original volume, and the upper surface of the second resin layer 72 returns to Za1. Because the thermal stress disappears when the second resin layer 72 contracts, the upward stress of the wire 40, etc., disappears. By repeating this action, there is a risk of fatigue fracture of the electrode plate connection portion 40a and/or the chip connection portion 40b of the wire 40.

Figure 3B:
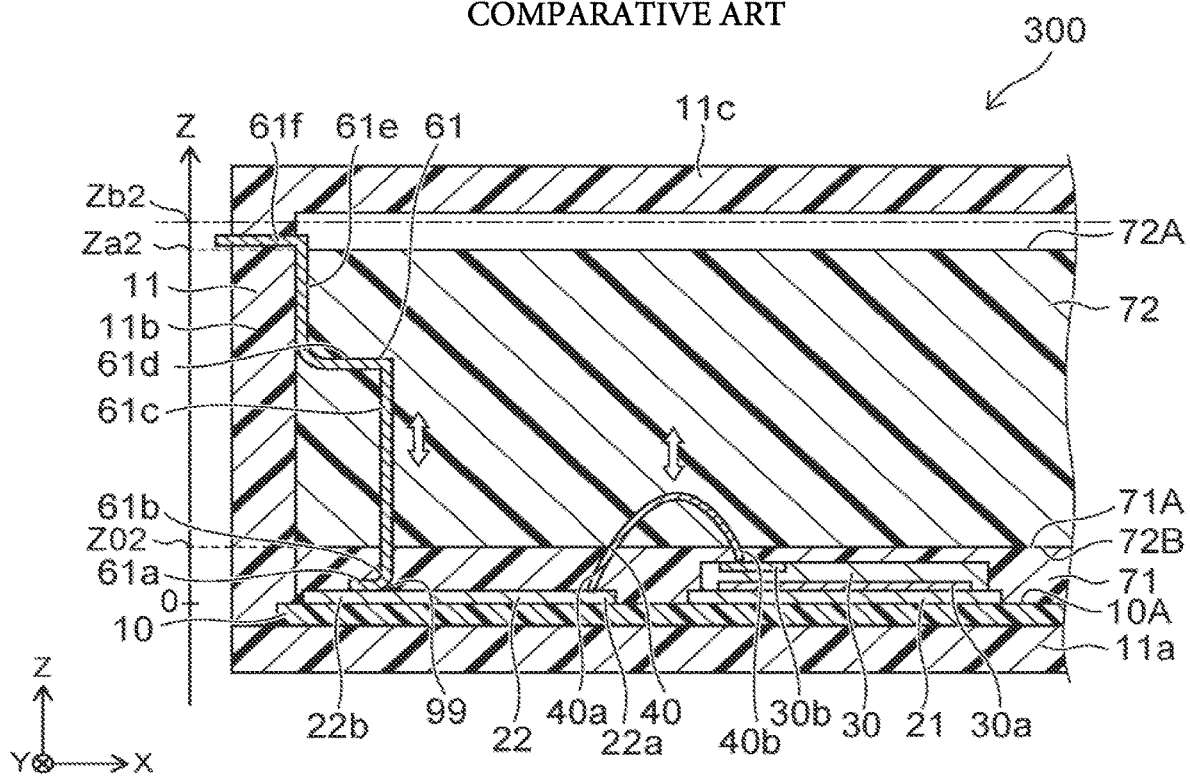
FIG. 3B is a partial cross-sectional view showing a power module according to a comparative example 2.

FIG. 3B is a partial cross-sectional view showing the power module according to the comparative example 2. The power module 300 has the structure of the comparative example 1 in which the first resin layer 71 also is used. To prevent the fatigue fracture of the electrode plate connection portion 40a and the chip connection portion 40b of the wire 40 described in reference to FIG. 3A, the first resin layer 71 that has a high elastic modulus and a low thermal expansion coefficient is disposed under the second resin layer 72, and the electrode plate connection portion 40a and the chip connection portion 40b of the wire 40 are disposed inside the first resin layer 71. When the second resin layer 72 undergoes thermal expansion due to the heat generation due to the conduction, the upper surface 72A of the second resin layer 72 is displaced from Za2 to Zb2. Compared to the second resin layer 72, the thermal expansion of the first resin layer 71 is small; therefore, the position of the upper surface of the first resin layer 71 is notated as-is as Z02 for convenience.

The fatigue fracture due to the thermal expansion of the second resin layer 72 can be suppressed because the electrode plate connection portion 40a and the chip connection portion 40b of the wire 40 are disposed inside the first resin layer 71. The first intermediate portion 61c, the second intermediate portion 61d, and the third intermediate portion 61e of the terminal plate 61 that are disposed inside the second resin layer 72 are subjected to upward stress from the second resin layer 72; therefore, the entire output terminal plate 61 is subjected to upward stress. In such a case, there is a risk that the first resin layer 71 that enters a wedge-like gap 99 between the lower surface of the curved portion 61b and the second connection portion 22b of the electrode plate 22 cannot deform with the micro displacement of the curved portion 61b subjected to the upward stress due to the high elastic modulus of the first resin layer 71, and the first resin layer 71 may separate from the curved portion 61b. When both the terminal plate 61 and the electrode plate 22 are formed of copper to bond using ultrasonic bonding, the first resin layer 71 that is formed of, for example, an epoxy resin undesirably separates even more easily from the lower surface of the curved portion 61b.

Conversely, according to the embodiment described above, the electrode plate connection portion 40a of the wire 40 can be protected by the first resin layer 71 having the high elastic modulus, and the gel second resin layer 72 enters the wedge-like gap 90 and therefore does not separate easily from the curved portion 61b of the terminal plate 61. Therefore, compared to the comparative example 1 and the comparative example 2, the reliability of the power module 100 according to the embodiment is high.

According to the embodiments described above, a power module that has high reliability can be realized.

Hereinabove, an embodiment of the invention is described with reference to specific examples. However, the embodiment of the invention is not limited to these specific examples. For example, one skilled in the art may similarly practice the invention by appropriately selecting specific configurations of the shapes, the materials, and the arrangements of the electrode plate, the metal member, the terminal plate, and the semiconductor chip included in the power module from known art, and such practice is within the scope of the invention to the extent that similar effects can be obtained. In particular, the materials of the electrode plate, the terminal plate, and the wire are not limited to copper or aluminum and may be another metal or mutually-different metals. Combinations of any two or more components of the specific examples within the extent of technical feasibility also are within the scope of the invention to the extent that the spirit of the invention is included. While certain embodiment has been described, this embodiment has been presented by way of example only, and is not intended to limit the scope of the invention. Indeed, the novel embodiment described herein may be embodied in a variety of other forms; furthermore, various omissions, substitutions and changes in the form of the embodiment described herein may be made without departing from the spirit of the invention. The accompanying claims and their equivalents are intended to cover such forms or modifications as would fall within the scope and spirit of the invention.

What is claimed is:

1. A power module, comprising:
a base plate having a first surface;
a plurality of electrode plates provided at the first surface;
a semiconductor chip provided on the first surface;
a wire connected to the semiconductor chip and one of the electrode plates;
a metal member connected to one of the electrode plates;
a terminal plate including a bonding portion, a curved portion, a first intermediate portion, a second intermediate portion, and a draw-out portion, the terminal plate being formed by stamping and bending a copper plate, the bonding portion contacting an upper surface of the metal member and extending along the upper surface, the curved portion being curved upward from the bonding portion, the first intermediate portion extending upward in a vertical direction from the curved portion, the second intermediate portion extending along the first surface of the base plate from the first intermediate portion, the draw-out portion being drawn out externally from the second intermediate portion;
a first resin layer, a connection portion of the wire and the semiconductor chip being disposed inside the first resin layer; and
a second resin layer provided on the first resin layer, the curved portion being disposed inside the second resin layer, an elastic modulus of the second resin layer being less than an elastic modulus of the first resin layer,
a length from the first surface to a lower surface of the bonding portion being greater than a length from the first surface to the connection portion, wherein
a wedge-like gap is formed between the lower surface of the curved portion of the terminal plate and the upper surface of the metal member, and
the second resin layer enters the wedge-like gap.

2. The module according to claim 1, wherein an upper surface of the first resin layer is positioned higher than the connection portion and positioned lower than the bonding portion.

3. The module according to claim 1, further comprising a bonding member contacting the metal member and the one of the electrode plates.

4. The module according to claim 1, wherein a thermal expansion coefficient of the first resin layer is less than a thermal expansion coefficient of the second resin layer.

5. The module according to claim 1, wherein the first resin layer includes an epoxy resin.

6. The module according to claim 1, wherein the second resin layer is a gel.

7. The module according to claim 1, wherein the bonding portion of the terminal plate is bonded to the upper surface of the metal member by ultrasonic bonding.

8. The module according to claim 1, wherein the wire is formed of aluminum.

9. The module according to claim 1,
further comprising a connection effect portion that has reduced bendability, and formed at an end portion of the wire at the connection effect portion side by connecting the connection portion and the semiconductor chip, and
the length from the first surface to the lower surface of the bonding portion is greater than a length from the first surface to an upper end of the connection effect portion.

10. The module according to claim 9, wherein an upper surface of the first resin layer is positioned higher than an upper end of the connection effect portion.

* * * * *